United States Patent
Satya et al.

[19]

[11] Patent Number: 5,959,459
[45] Date of Patent: Sep. 28, 1999

[54] DEFECT MONITOR AND METHOD FOR AUTOMATED CONTACTLESS INLINE WAFER INSPECTION

[75] Inventors: Akella Venkata Surya Satya, Wappingers Falls; Tessema Kebede, Peekskill, both of N.Y.; Leon Ray Bentson, Colchester, Vt.

[73] Assignee: International Business Machines Corporation, Armonk, N.Y.

[21] Appl. No.: 08/763,189

[22] Filed: Dec. 10, 1996

[51] Int. Cl.$^6$ .................................................. G01R 31/305
[52] U.S. Cl. ............................................ 324/751; 324/501
[58] Field of Search ..................... 324/500, 501, 324/751; 250/310, 311

[56] References Cited

U.S. PATENT DOCUMENTS

| | | | |
|---|---|---|---|
| 4,417,203 | 11/1983 | Pfeiffer et al. | 324/501 |
| 4,706,019 | 11/1987 | Richardson | 324/158 |
| 4,730,158 | 3/1988 | Kasai et al. | 324/158 |
| 4,843,329 | 6/1989 | Beha et al. | 324/73 |
| 4,868,492 | 9/1989 | Beha et al. | 250/472.1 |
| 5,122,753 | 6/1992 | Myers et al. | 324/537 |
| 5,130,644 | 7/1992 | Ott | 324/754 |
| 5,192,913 | 3/1993 | Goruganthu et al. | 324/537 |
| 5,404,110 | 4/1995 | Golladay | 324/751 |
| 5,500,603 | 3/1996 | Le | 324/751 |

OTHER PUBLICATIONS

Bentson, L.R. "Monitoring Defects by Scanning Electron Microscope Beam Charging", IBM Technical Disclosure Bulletin, BU884–0024, vol. 31, No. 6, Nov. 1988, pp. 476–477.

*Primary Examiner*—Josie Ballato
*Assistant Examiner*—Russell M. Kobert
*Attorney, Agent, or Firm*—Schmeiser, Olsen & Watts; Jay Anderson

[57] ABSTRACT

According to the preferred embodiment, a defect monitor is provided that facilitates the location and characterization of defects in a semiconductor device. The defect monitors are designed to facilitate automated scanning electron microscope in voltage contrast mode (SEM-VC) inspection. The defect monitors include a plurality of flags used to quickly locate defects. The SEM-VC magnification can then be increased to further isolate and characterize the defects as necessary. Thus, the preferred embodiment facilitates the use of SEM-VC scanning procedures to automatically detect and locate faults at low magnification, and then characterize the faults a higher magnification, resulting in a much higher throughput.

15 Claims, 7 Drawing Sheets

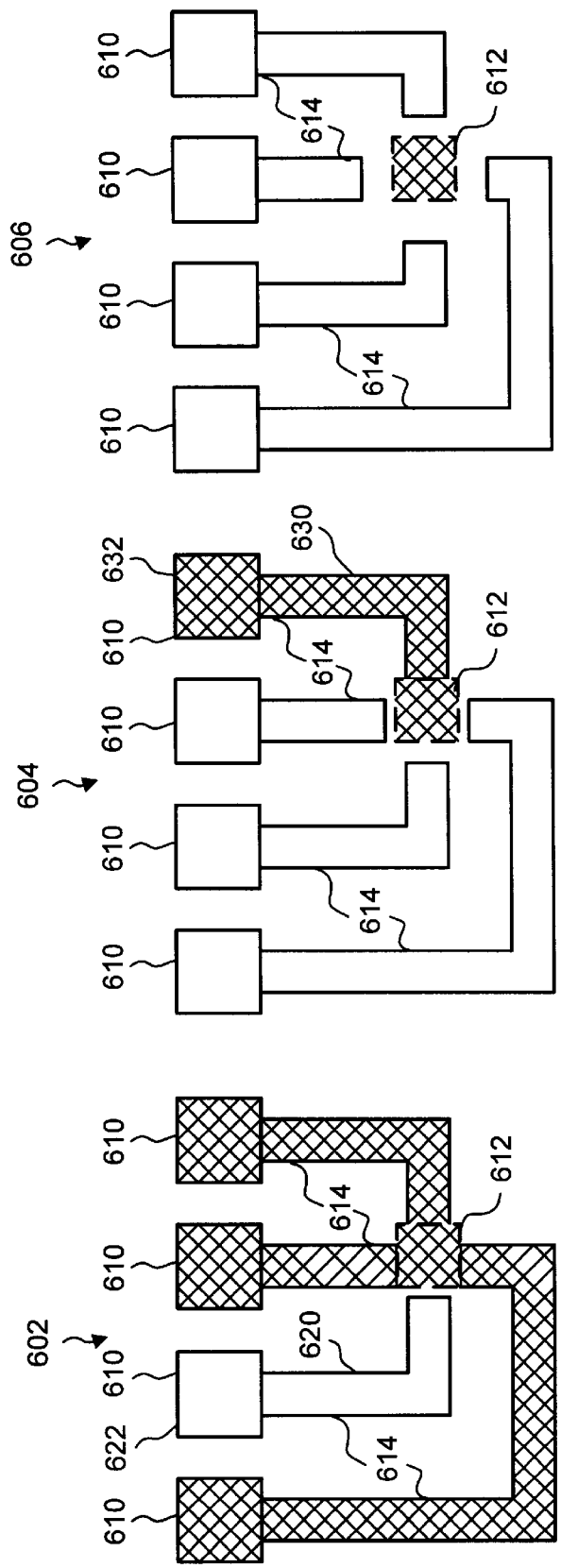

DEFECT MONITOR AND METHOD FOR AUTOMATED CONTACTLESS INLINE WAFER INSPECTION

BACKGROUND OF THE INVENTION

1. Technical Field

This invention generally relates to semiconductor processing and more specifically relates to defect monitoring in semiconductor processing.

2. Background Art

An ongoing concern in semiconductor technology is the maximization of fabrication yield. One factor that leads to a reduction in fabrication yield is the presence of process-induced defects in the semiconductor device. Random defects are typically caused by foreign material (FM), particularly in the form of particles. The result of these defects are frequently circuit failure caused by unwanted opens in conductive lines, shorts between adjacent conductive lines, or shorts between overlying conductive lines.

An analysis of process-induced defects can be very useful in identifying and eliminating yield detractors. However, because of the complexity of modem Very Large Scale Integrated (VLSI) circuits, testing the actual semiconductor devices is very time consuming and costly. Additionally, the information gained from testing the actual devices is limited, as it is often impossible to determine the extent and frequency of the processing defects.

As a result of the above problems, it is preferable to fabricate special semiconductor-processing defect monitors that are dedicated to the analysis of processing defects. These defect monitors are built with structures comparable in sensitivity to defects to those in the VLSI devices, but in such a way that the presence and type of defects are more easily ascertained. These defect monitors are typically constructed at the same time but in a different chip location on the semiconductor substrate than the product VLSI devices, and are discarded once the useful defect information is extracted from them.

These defect monitors can be used either by periodically fabricating a wafer with the defect monitor chips in the production line, replacing some product chips on a sampling basis, or by including the defect monitor in otherwise unused portions of the semiconductor wafer. The latter approaches have the advantage of having the defect monitor fabricated in the exact processing environment as the actual VLSI devices. Thus, the defects in the defect monitors more accurately reflect the defects that exist in the actual VLSI device on a statistical basis with high correlation.

For the same reason, it is desirable that the defect monitors use similar structure types and geometries found in the actual device to ensure equal sensitivity to defects, and are thus preferably manufactured using the same process as the actual device.

Some attempts have been made to use visual inspections to locate defects. While these inspections can reveal the contamination or the presence of FM, they cannot always distinguish between FM that causes electrical failures and those that do not. Additionally, as the size of VLSI devices has decreased and the density of these devices on a wafer has increased, the optical resolutions available are increasingly inadequate to perform this type of inspection quickly and accurately.

Thus, in the prior art defect monitors were limited to either visually locating the number and distribution of defects in a relatively quick in line inspection process, or allowing characterization of the defects in a time consuming, off-line failure analysis of the product chips after final test. Most serious analysis used to identify and isolate the specific defect mechanisms that cause devices failures has been relegated to off-line testing and tedious unlayering of the product chips. Although time consuming, this analysis is a critical tool in characterizing unique and complex defect mechanisms. However, the time required for a detailed failure analysis makes this method unsuitable for in situ (i.e., in-place) testing of the semiconductor wafer during wafer processing.

Therefore what is needed is a defect monitor structure and method that can be used in situ to characterize the type of defect as well as to determine the distribution of these defects.

DISCLOSURE OF INVENTION

According to the present invention, a defect monitor is provided that facilitates the location and characterization of defects in a semiconductor device. The defect monitors are designed to facilitate and use the automation of a Scanning Electron Microscope in Voltage contrast mode (SEM-VC) inspection. The defect monitors include a plurality of flags that are used to quickly locate defects at low magnification. The magnification can then be increased to further isolate and characterize the defects as necessary.

It is thus an advantage of the present invention to facilitate the use of SEM-VC scanning procedures to automatically detect and locate faults at low magnification, and then characterize the faults in situ at a higher magnification, resulting in a much higher throughput.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIG. 7 is a schematic view of an interlevel alignment monitor 600 where interlevel alignment is incorrect.

BEST MODE FOR CARRYING OUT THE INVENTION

Figure 1:
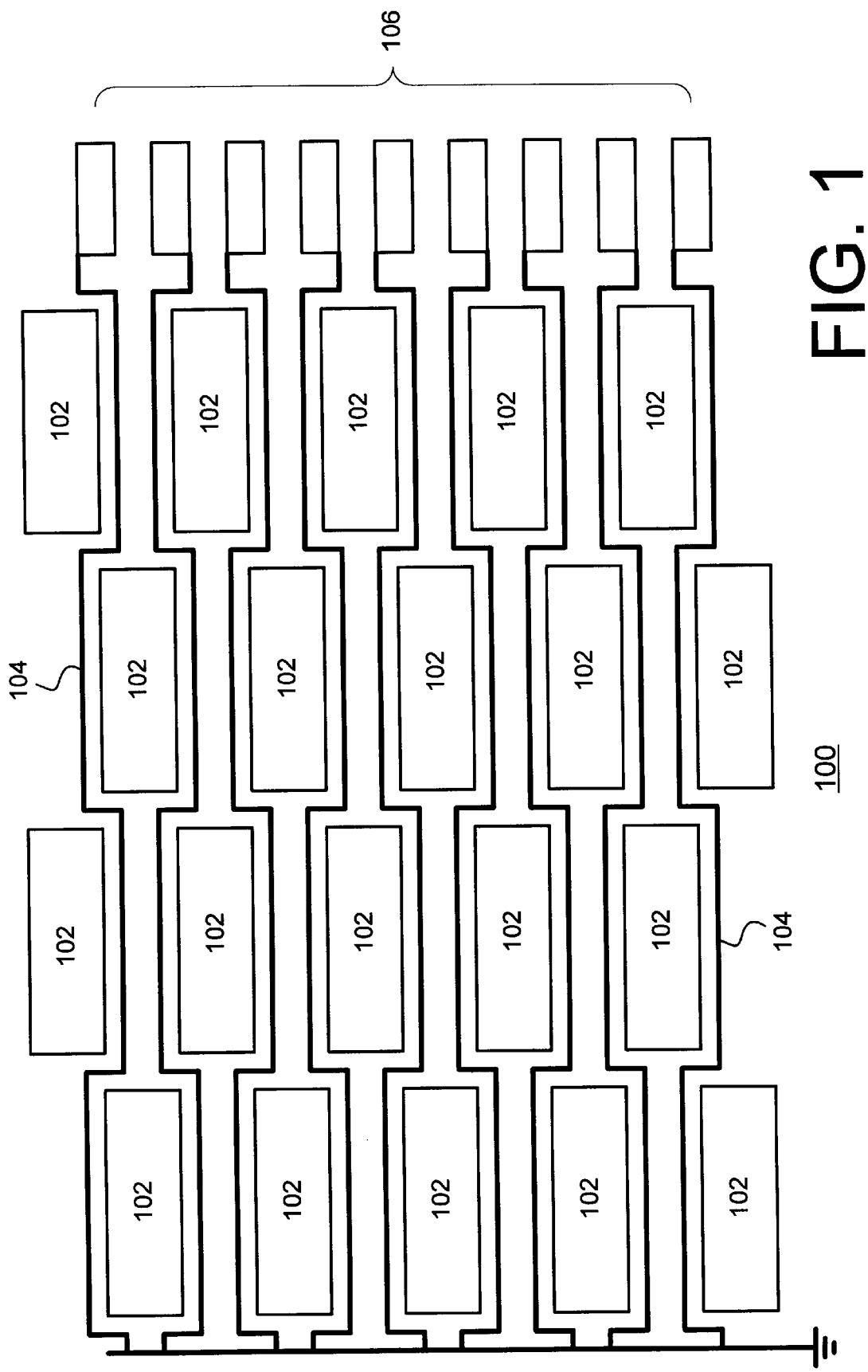
FIG. 1 is a schematic view of a defect monitor structure 100 in accordance with the preferred embodiment.

A Scanning Electron Microscope (SEM) operating in Voltage Contrast mode (SEM-VC) is known to offer the ability to distinguish charged-up floating-conductor shapes from charge-drained electrically grounded-shapes by causing visual contrast between them. The SEM-VC uses a high current, low energy electron beam. The electrons from the SEM are absorbed into the conductors on the semiconductor wafer. With the wafer grounded, those conductors which are grounded through the wafer will be charge-drained, absorbing the incident electrons, while those conductors which are floating will be charged-up with the incident electrons. This creates a visual contrast between floating and grounded conductors that can be monitored on a CRT screen or stored and analyzed electronically. However, the manual monitoring of defects on the device using the SEM in the VC mode is very tedious and slow due to the complexity of a typical semiconductor device and the high magnification required when searching, and the poor contrast on the CRT screen.

One test structure designed for SEM-VC defect monitoring was disclosed by L. R. Bentson in "Monitoring Defects by Scanning Electron Beam Charging," IBM Technical Disclosure Bulletin, Vol. 31, No. 6 November 1988.). The structure disclosed there used long serpentines of grounded conductors as line-open monitors woven around long floating lines as short monitors. This test structure allows defects that caused shorts to be found by finding the location of the brightness change. While this design facilitated the location of defects, it required a detailed examination at high magnification of the entire structure to find the location of the shorts defect. Thus, this inspection process was too slow to be used for in line characterization of defects. Additionally, this process was limited to finding open conductors or shorts between adjacent conductors, and did not teach how to detect interlevel defects; or how to automate the tedious inspection process.

For this reason, several monitor structures in accordance with the preferred embodiment have been designed to facilitate automated SEM-VC inspection. These monitors facilitate the use of simple procedures to automatically detect and locate electrical faults at low magnification, resulting in a much higher throughput than prior SEM-Wafer-Inspection Stations (SEM-WIS). When defects are located, the magnification of inspection can be increased, facilitating the in-situ characterization of the defects. Thus, the monitor structures facilitate the inline use of the SEM-VC to detect and characterize fault causing defects.

In accordance with the preferred embodiment, a variety of monitor structures are fabricated into the dicing-kerf regions or as a distinct test chip on the semiconductor wafers. The wafers are autoloaded into the SEM inspection chamber. The SEM autoaligns the wafer in the inspection chamber and inspects the wafers for defects in the VC mode at low magnification. Preferably, the SEM is programmed for automatic defect-isolation and alerting the operator for an in-situ foreign material characterization at a higher magnification when a defect is located and the particle causing the defect is still present.

Rapid throughput in inspection at low magnification is facilitated by the use of flags of relatively large dimension that can be easily scanned at high speed by an SEM-VC at low magnification. The flags are relatively larger than the monitor lines themselves, but are much smaller than traditional test pads used for contact probe testing (which are typically 75×75 $\mu$m with 50 $\mu$m of spacing). Each flag is connected to one monitor line. These flags serve to improve the signal to noise ratio of the secondary electron intensity in the SEM at low magnification.

In the preferred embodiment the location and characterization of the defects is controlled by computer-implemented algorithms that can quickly and accurately use the preferred embodiment defect monitors to locate and characterize defects. To achieve the best results using the defect monitors the microalignment of the wafer is critical. Because of this, the preferred embodiment uses computer controlled auto-microalignment to quickly and accurately align the wafers for scanning. This facilitates the e-beam scan-line passing correctly through a linear array several hundred flags that may be used in the defect monitor.

Turning now to FIG. 1, a monitor structure 100 in accordance with the preferred embodiment is shown schematically. The monitor structure 100 is fabricated as part of the conductive layer that includes a metal or polysilicon interconnect level, such as a metal layer 1, using the same technologies/process as in the actual semiconductor devices for which the monitor structure 100 will be used. The monitor structure 100 comprises a plurality of monitor conductor shapes 102, a plurality of monitor lines 104, and a plurality of monitor flags 106. The plurality of monitor conductor shapes 102, plurality of monitor lines 104, and plurality of monitor flags 106 are preferably fabricated in the same interconnect level and will be used to detect and characterize intralevel defects causing shorts and opens in that interconnect level. Additionally, the plurality of monitor conductor shapes 102, plurality of monitor lines 104, and plurality of monitor flags 106 are preferably fabricated using the same process and process tools (i.e., damascene, reactive ion etching (RIE)), with the same minimum dimensions, as in the actual semiconductor devices for which the monitor structure 100 will be used for defect characterization.

The portion of the monitor structure illustrated in FIG. 1 is not shown to scale for clarity reasons. An actual monitor structure would suitably have more rows and more columns of monitor conductor shapes with monitor lines fabricated throughout. The actual number of monitor structures and monitor lines used would depend on the size and density of the fabrication technologies used, and the defect density to be monitored.

The plurality of monitor conductor shapes 102 are preferably floating, isolated from the ground and substrate. Preferably, the plurality of monitor conductor shapes 102 are arranged in an array of columns, with adjacent columns of conductor shapes offset from each other. In the illustrated embodiment, the monitor conductor shapes 102 comprise rectangles, however, other suitable shapes can be used. The plurality of monitor shapes 102 are large enough to be easily distinguished by an SEM-VC at relatively low magnification (60×100×magnification), and thus preferably have an area of 10 to 50 $\mu$m$^2$. In the preferred embodiment, the monitor shapes 102 are substantially rectangles and sized between 2×5 $\mu$m to 5×10 $\mu$m.

The plurality of monitor lines 104 comprise conductor lines that run through the plurality of floating conductor shapes 102. The plurality of monitor lines 104 are each grounded on one end attached to one of the plurality of monitor flags 106 on the other. The plurality of monitor lines can be grounded in any suitable way, such as vias down to the substrate. The plurality of monitor lines 104 are preferably fabricated with a width equal to the minimum dimension width on the actual semiconductor devices for which the monitor structure 100 will be used to characterize the defects. In another embodiment, the width and shape-detail of the monitor lines 104 are varied according to particular needs to reflect the product chip designs. Furthermore, the monitor lines 104 should be fabricated on top of similar topography as in the product chip.

In the preferred embodiment, the plurality of monitor lines 104 substantially surround the plurality of monitor conductor shapes 102 maintaining a predetermined distance from adjacent conductor shapes 102. The width of the monitor lines is preferably the minimum design-rule conductor width. Likewise, the distance between monitor lines 104 and adjacent monitor conductor shapes 102 is the minimum design rule spacing.

Each of said plurality of lines 104 is connected to one of the plurality of flags at one end, and is grounded on the other end. The plurality of monitor flags 106 are preferably conductor shapes wide enough to be distinguished by an SEM-VC at relatively low magnification (60×to 100×) and long enough for the e-beam scan line to easily hit. Thus, the plurality of monitor flags 106 are preferably sized between 5 and 20 $\mu m^2$. In the preferred embodiment, the monitor flags 106 are substantially rectangles and are sized between 1×5 $\mu m$ to 2×10 $\mu m$.

Figure 2:
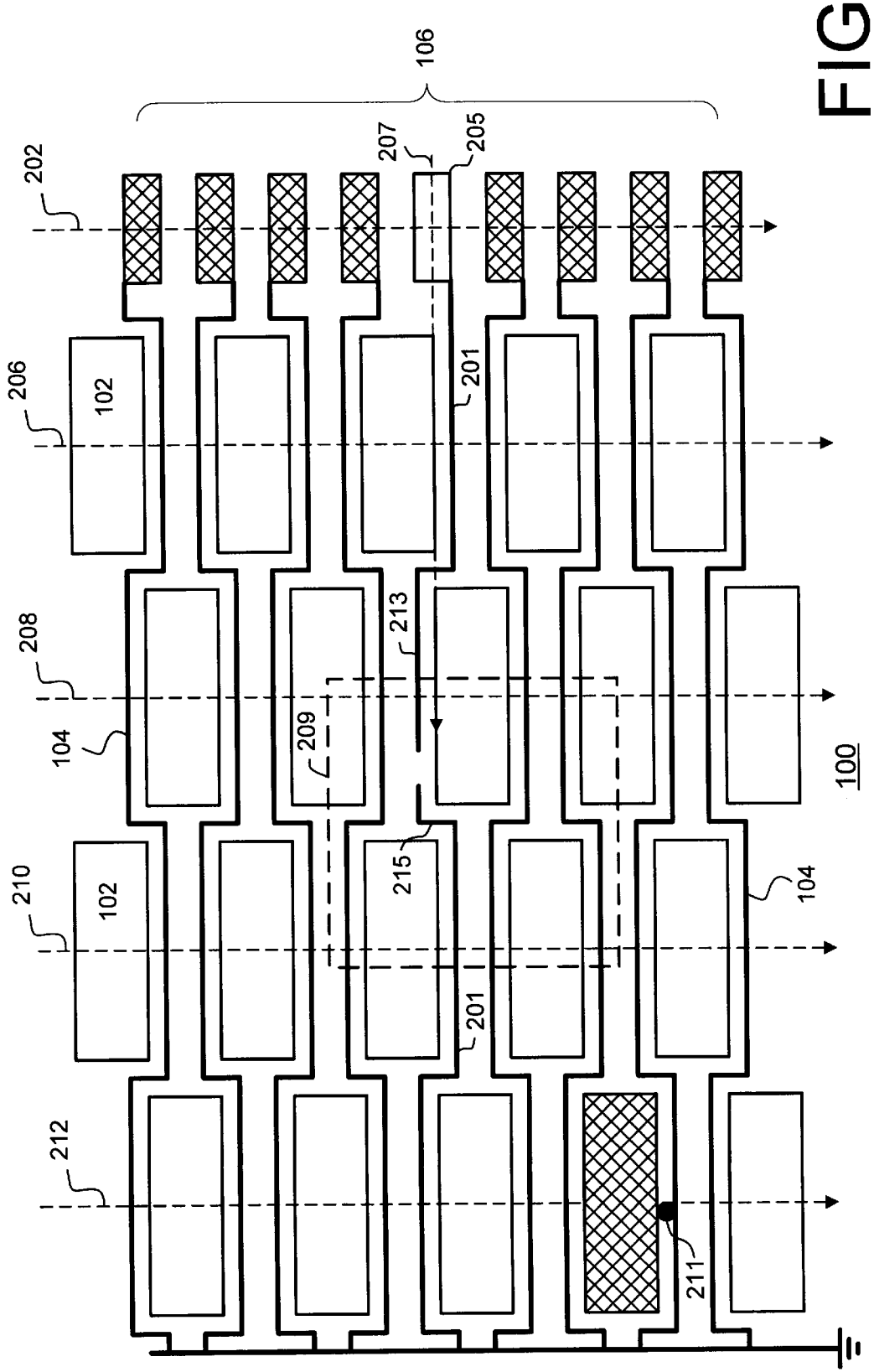
FIG. 2 is second schematic view of the defect monitor structure 100 in accordance with the preferred embodiment.

Turning now to FIG. 2, FIG. 2 shows a second schematic view of monitor structure 100. Depending upon the mode of operation, floating conductors exposed to an SEM-VC e-beam scan line appear either bright or dark in contrast with the grounded conductors. In the embodiments illustrated in FIGS. 1–7, the grounded conductors are assumed to appear bright while floating conductors appear dark, or "disappear." Of course, the invention is equally applicable to use with SEM-VC scans in the other mode, with floating conductors appearing bright and grounded conductors appearing dark. Thus, in FIG. 2, the elements are shown as they might appear on a CRT screen when exposed to the SEM-VC e-beam scan line where grounded conductors appear bright. In FIG. 2, conductors appearing bright when exposed to the SEM-VC scan line are illustrated as cross-hatched to distinguish them from conductors that are floating which partially "disappear" from the CRT view. Thus, the intensity variation can be used to differentiate between floating and grounded conductors. The grounded conductors can be distinguished and/or counted by the brightness peaks generated when exposed to the SEM-VC scan line. Thus, the number of conductors that remain grounded (without defects causing opens) can be determined by counting the number of peaks.

The preferred test method scans the monitor structure flags for fault causing defects, and facilitates the detailed characterization of the defects. In particular, opens in the monitor lines and shorts between monitor lines and monitor conductor shapes are scanned for. Preferably, the first step is to scan the plurality of flags 104 with the SEM using a very low magnification (typically 60×–100×) For example, the SEM-VC scans down line 202. Flags that are connected to ground through one of the plurality of monitor lines 104 appear bright to the SEM. These bright flags can be distinguished from those dark flags that have lost their connection to ground because of some open defect in the line. Thus, SEM-VC looks for a missing brightness peak in the scan line intensity profile, where such a missing peak exists, the flag is not grounded. When the SEM scan line 202 finds the flag(s) not connected to ground, the SEM locates its position/location from the intensity analysis and offsets its field of view to that the flag is in the center of its view. The SEM then steps down the pattern line at a relatively high magnification (preferably 500×to 1000×) SEM scan until the defect is located. In the illustrated example of FIG. 2 the flag 205 is disappearing, and thus a short exists somewhere along monitor line 201. The disappearing flag 205 is then centered in the SEM field of view. The scan is then offset down monitor line 201, following scan line 207. The scanning preferably involves stepping the SEM view area a predetermined distance and scanning the front-end and back-end of each field of view where the monitor line runs between monitor conductor shapes 102.

The scanning of the monitor line stops when a difference is detected between the number of line intensities of the front-end scan and the back-end scan. For example, in FIG. 2 when the SEM scans the field of view portion 209, the SEM scan will detect a difference in the intensity profile of the front edge of portion 209 and the back edge of portion 209. In particular, the ungrounded portion 213 of monitor line 201 contrasts with the still-grounded portion 215 of monitor line 201, causing the intensity profile difference. This intensity difference signifies the location of the defect. At this point, the magnification can be increased (preferably to 1000×–1000×) to diagnose and characterize the defect that caused the open fault via a electro-micro-graph and/or an Energy Dispersive Spectrometry (EDS) analysis per a sampling plan. EDS is a method of bombarding the particle with a high-energy focused e-beam and analyzing the reflected electrons for a quantitative analysis of the particle. After the characterization of the fault, the SEM returns to the plurality of flags 106 and repeats this procedure on more disappearing flags, if any.

Thus, the preferred test method using the preferred monitor structure facilitates a very rapid and efficient isolation and characterization of the defects causing the open circuit faults. This is done by first scanning quickly at a low magnification for the high contrast flags until the defect is located. The larger size of flags 106 relative to the lines 104 assures a good signal-to-noise ratio when a SEM-VC scan line is drawn quickly through the flags 106 at low magnification. Then the magnification of the scan can be increased and the location of the defect found. Finally, the magnification is increased again to characterize any remaining particles with high energy magnification EDS procedures.

Next, the monitor structure 100 is scanned for defects causing shorts between the monitor conductor shapes 102 and the monitor conductor lines 104. This is preferably done by drawing a scan line down each column of monitor conductor shapes 104 using a low magnification SEM-VC. For example, scan lines 206, 208, 210 and 212 are drawn down the respective monitor conductor shape columns.

As an example, the low magnification SEM-VC scanning is done down column 212. From the intensity profile, the SEM-VC finds one of the plurality of monitor conductor shapes 102 that appears bright. This brightness means that the normally floating monitor conductor shape is grounded, caused by a short to one of the adjacent monitor lines 104. When a grounded monitor conductor shape is found the magnification is increased and the defect characterized by taking an electromicrograph at this high magnification. When the defect 211 is found, the SEM offsets its field of view with the monitor shape 102 at its center, increases the magnification (1000×–2000×) and diagnoses and characterizes the defect that caused the short via a electro-micro-graph and/or an EDS-analysis per a sampling plan. After the characterization of the fault, the SEM returns to scanning the next of the monitor conductor shapes 102 at low magnification. Thus, once again the scanning for defects can be done quickly, at low magnification. When a defect is located, the magnification can be increased and the all the defects characterized.

Figure 3:
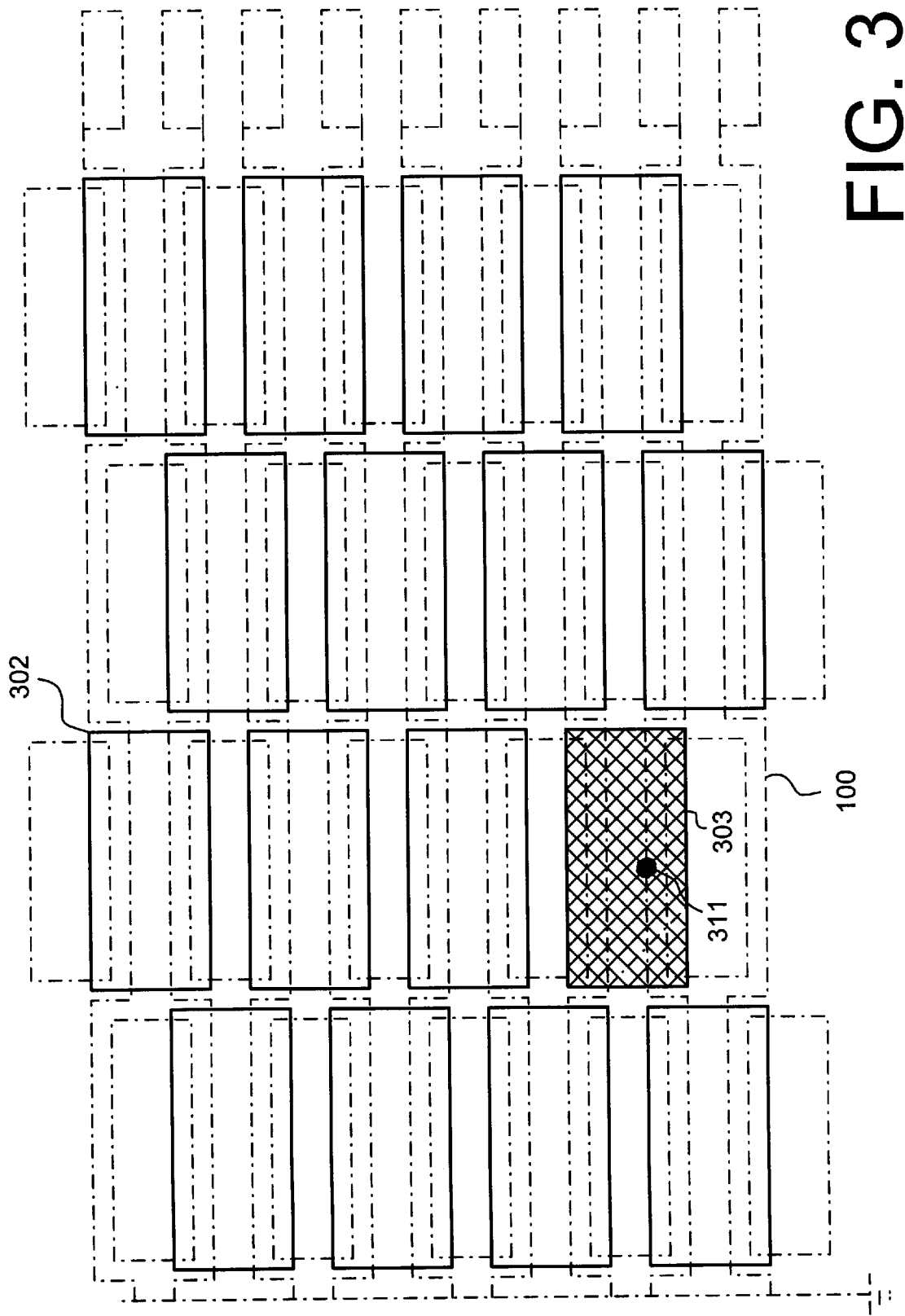
FIG. 3 is a schematic view of a monitor structure 100 expanded to detect interlevel shorts between interconnect levels.

The monitor structure 100 illustrated in FIGS. 1 and 2 can be expanded to detect interlevel shorts between interconnect levels. In FIG. 3, the original portion of the monitor structure 100 fabricated on the earlier interconnect level is shown in phantom. On top of the original monitor structure 100 is fabricated a plurality of interlevel monitor shapes 302, formed as part of the next-level conductor shapes. The interlevel monitor shapes 302 are fabricated in an array juxta-positioned over the monitor shapes 102 and overlaying monitor lines 104 in the original monitor structure 100. The interlevel monitor shapes 302 are designed to be floating or electrically isolated from the device substrate and the original monitor structure 100. However, when a defect causes a short between an interlevel monitor shape and a monitor line below it, the interlevel monitor shape will appear bright to the SEM-VC scan. Thus, the interlevel monitor shapes 302 serve as flags and interlevel shorts can be easily located in a manner similar to intralevel defects as discussed in relation to FIG. 2. For example, a defect 311 causes an interlevel short between interlevel monitor shape 303 and a monitor line below it. When the interlevel monitor shape 303 is scanned it will appear bright. The magnification can then be increased for characterization of the defect.

Figure 4:
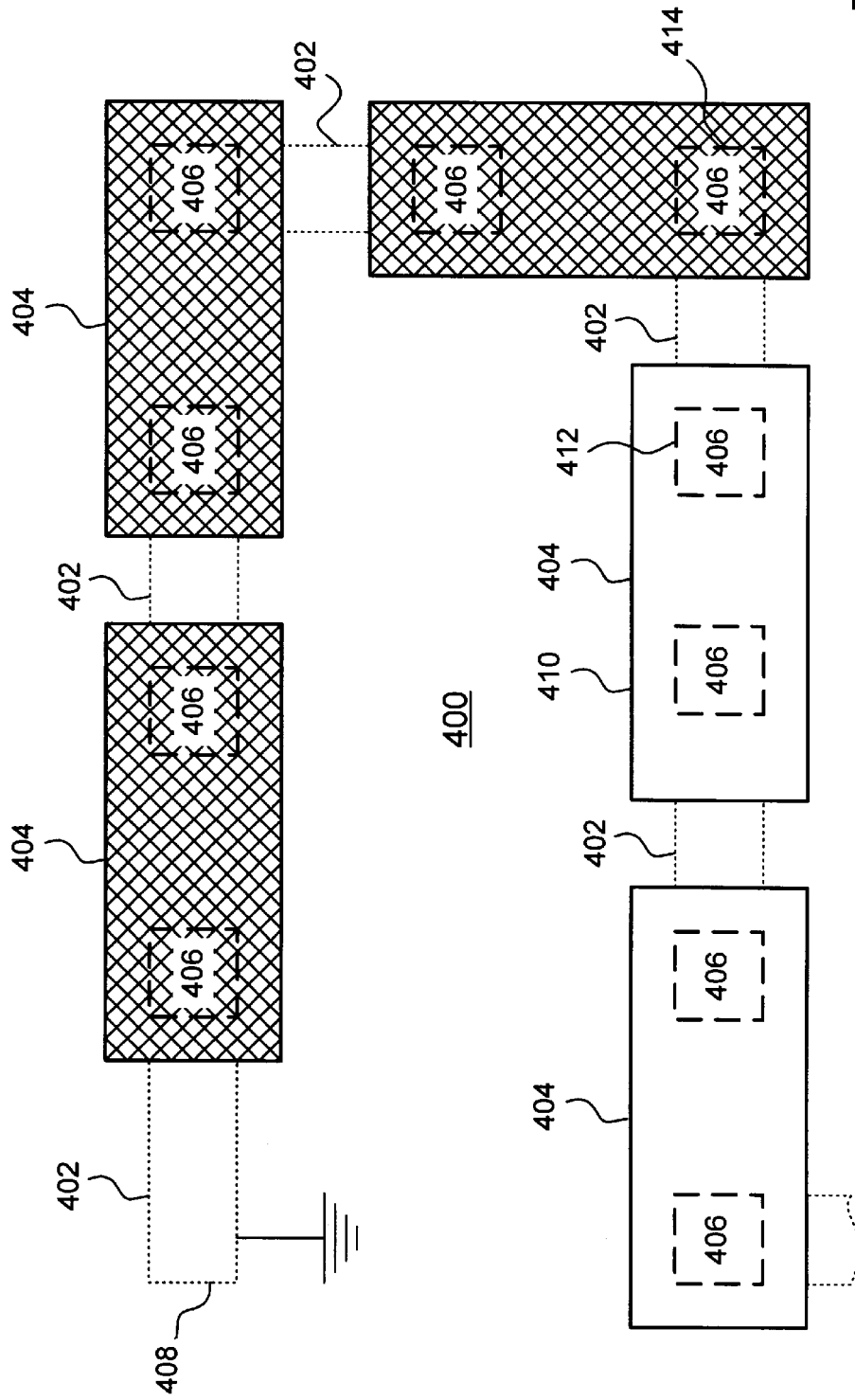
FIG. 4 is a schematic view of an interlevel open defect monitor 400.

Turning now to FIG. 4, FIG. 4 is a schematic view of an interlevel contact or via open defect monitor 400. The interlevel contact open defect monitor 400 comprises a plurality of first level conductors 402 (fabricated on a first interconnect level), a plurality of second level conductors 404 (preferably one interconnect level above the first level), and a plurality of interconnect contacts or vias 406. The plurality of first level conductors 402 and plurality of second level conductors 404 are connected in an alternating series with first level conductors connected to adjacent second level conductors by one of the plurality of vias 406, with one end 408 of the alternating series connected to ground.

The defect monitor 400 is then scanned by the SEM-VC. Those of the plurality of second level conductors 404 that are properly connected to the ground serve as a flag and appear bright to the SEM-VC. Where a defect causing an open exists in the via (typically by the defect blocking via formation), the next one and onwards of the plurality second level conductors 404 will disappear. Thus, an open in a via can be easily located with a low magnification SEM-VC scan. The magnification can then be increased for characterization of the defect.

In the illustrated embodiment, the second level conductor 410 and beyond has disappeared. Thus, a defect open exists in either via 412 or 414. The exact location and characterization of the defect can be determined by a high magnification micrograph. Thus, the defect monitor 400 can thus be used to locate contant/via open defects, but without the need for large probe pads found in prior art solutions that require electrical test probes to electrically find defects.

Figure 5:
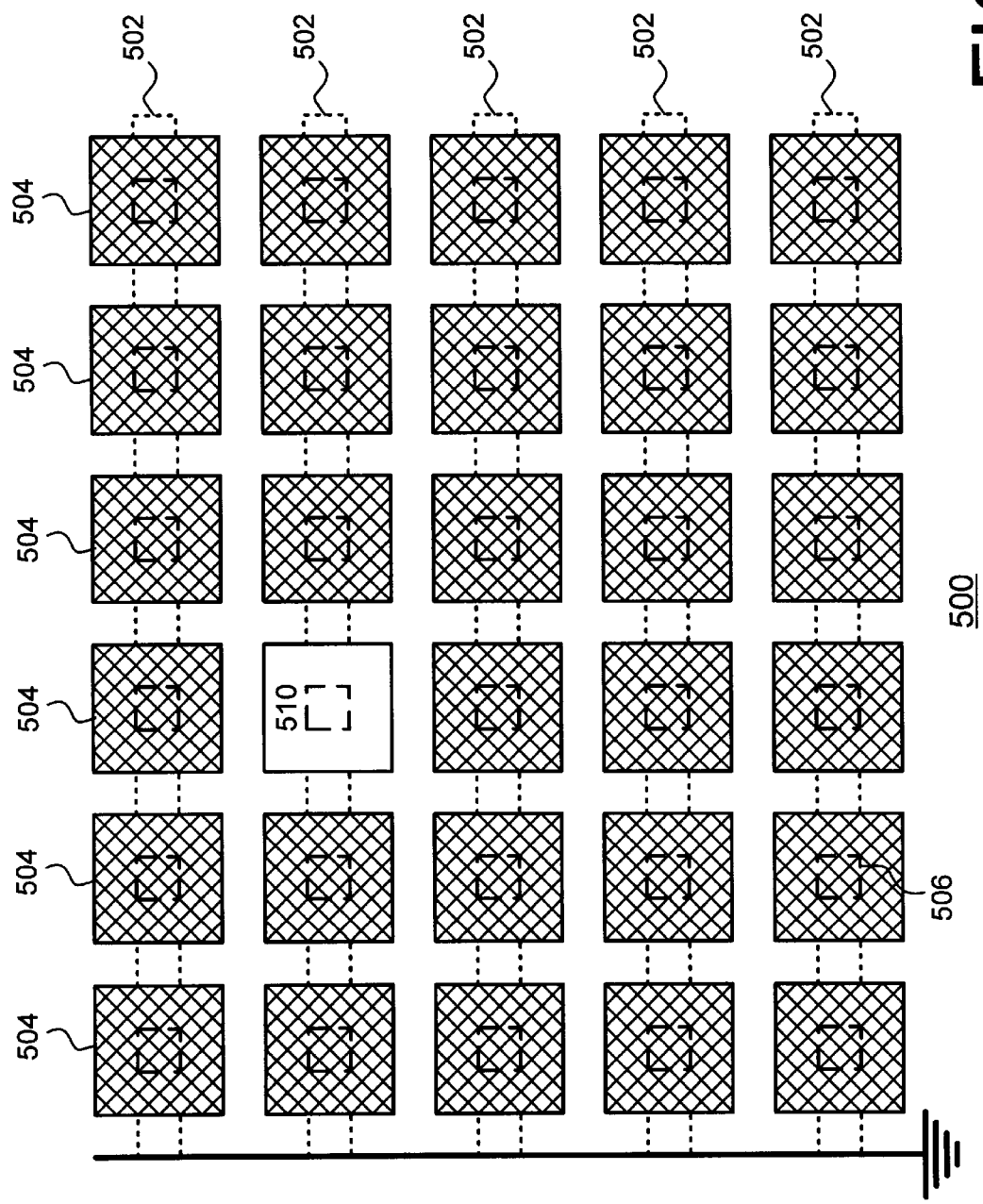
FIG. 5 is a schematic view of an interlevel open defect monitor 500.

Turning now to FIG. 5, FIG. 5 is a schematic view of an interlevel contact/via open defect monitor 500. The defect monitor 500 comprises a plurality of first level conductors 502. Above each of the plurality of first level conductors 502 is a plurality of second level conductors 504. An interconnect via 506 connects each second level conductor 504 with the first level conductor 502 below it. Thus, an array of monitor structures is provided. Each of said plurality of first level conductors 502 is connected to ground. With the first level conductors 502 connected to ground, and each of the second level conductors 504 connected to a first level conductor 502 through a via 506, the second level conductors 504 will serve as a flag and appear bright to a SEM-VC scan unless a defect causes an open between the second level conductor 504 and the first level conductor 502. In an alternative embodiment, the pattern can be even more compact by providing ground connection to the substrate directly below the vias 506 by providing contacts below the first metal layer to the substrate.

In the illustrated example, second level conductor 510 has disappeared. Thus, a defect exists between second level conductor 510 and the first level conductor below it. Again, the second level conductors 510 are preferably large enough that the defects can be quickly located with a relatively low magnification scan. After a second level conductor with a defect is located, the magnification can be increased for possible characterization of the defect, although in some cases unlayering will be required to completely characterize the defect. The ability to quickly locate and characterize the defects makes this process suitable for in situ defect monitoring and characterization.

Figure 6:
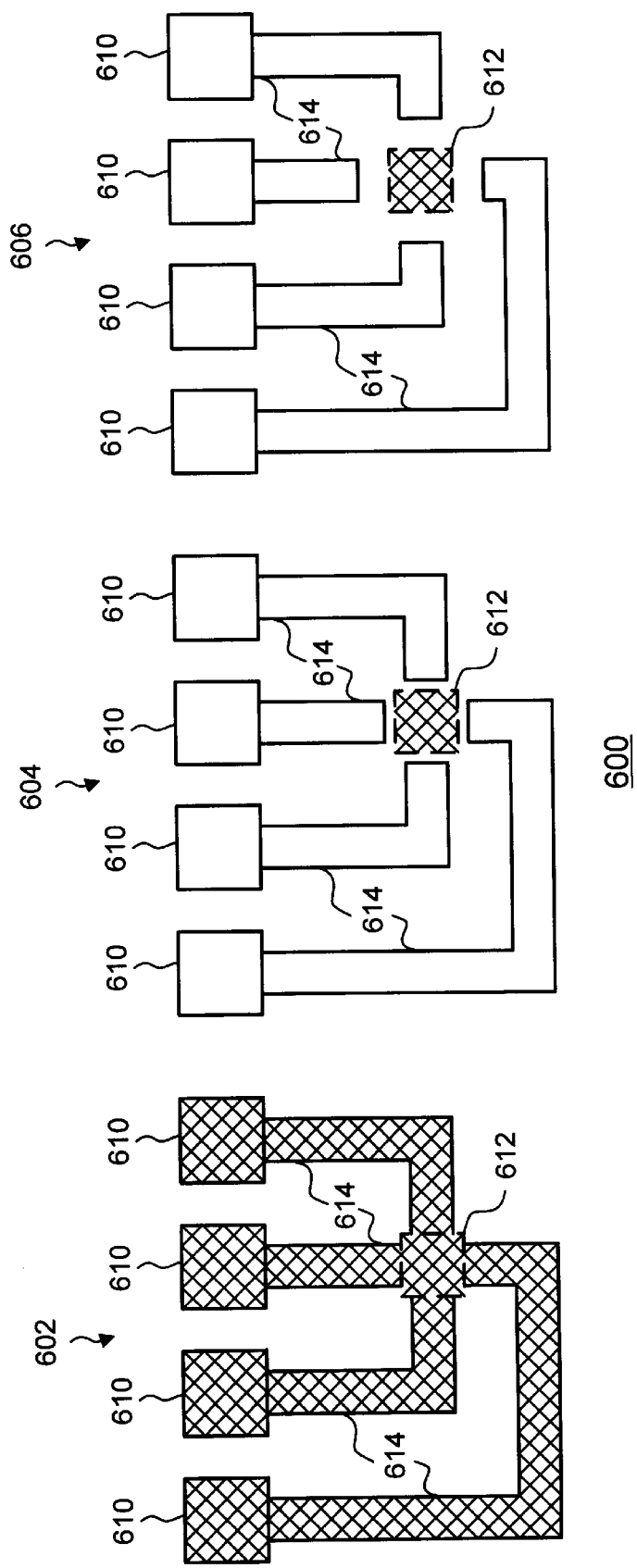
FIG. 6 is a schematic view of an interlevel alignment monitor 600 where interlevel alignment is proper.

Turning now to FIG. 6, FIG. 6 is a schematic view of an interlevel alignment monitor 600 where interlevel alignment is proper. The interlevel alignment monitor 600 comprises a plurality of alignment gauges 602, 604 and 606. Each alignment gauge has a plurality of flags 610. A via 612 in each alignment gauge is connected to the interconnect level below or to the substrate, which is connected to ground. Conductors 614 connect the flags 610 to the region surrounding the via 612. The distance between the conductors 614 and the via 612 vary from one alignment gauge to the next alignment gauge in the alignment monitor. Preferably, the distance between the conductors 614 and the via 612 increase in a small amount from alignment gauge 604 to alignment gauge 606 in a Vernier-gauge fashion. In the illustrated embodiment, the conductors 614 of alignment gauge 602 run to the edge of where the via 612 will be if alignment is exact and proper. Conversely, a small space exists between the conductors 614 and via 612 of alignment gauge 604. Likewise, a larger space exists between the conductors 614 and via 612 of alignment gauge 606.

Thus, if alignment is proper, all the flags 610 of alignment gauge 602 will be grounded and appear bright when subjected to a SEM-VC scan. Likewise, if alignment is proper, all the flags 610 of alignment gauges 604 and 606 will disappear when their flags are scanned.

Turning now to FIG. 7, FIG. 7 is a schematic view of an interlevel alignment monitor 600 where alignment is incorrectly offset. In this case, the mask used to create the interconnect level of which alignment monitor 600 is a part was misaligned, such that the alignment monitor 600 is offset to the left of where it should be. With such an offset, one of the conductors 620 of alignment gauge 602 is not connected to via 612. Thus, the flag 622 connected to that conductor will disappear when subjected to a SEM-VC scan line. Also, the offset has caused conductor 630 of alignment gauge 604 to be connected to via 612. Thus, the flag 632 will be bright when subjected to a SEM-VC scan. The offset was not great enough however, to cause any of the conductors of alignment gauge 606 to touch via 612. Thus, no flags 610 on alignment gauge 606 will be bright when subjected to a SEM-VC scan.

Thus, by performing a SEM-VC scan along the row of flags 610, a determination can be made a to whether alignment is proper. Also, the amount of misalignment, if any, can be bracketed and the direction of misalignment determined.

Thus, several monitor structures are provided that facilitate an in situ location and characterization of various types of fabrication defects. The monitor structures can be adapted to monitor a wide variety of technologies. The monitor structures facilitate automated contactless wafer inspection using a SEM-VC scan for rapid defect monitoring, and in situ defect isolation and characterization.

While the invention has been particularly shown and described with reference to a preferred exemplary embodiment thereof, it will be understood by those skilled in the art that various changes in form and details may be made therein without departing from the spirit and scope of the invention. For example, the various grounds shown in FIGS. 1–7 can be accomplished in any way consistent with the manufacturing process used to create the defect monitors.

We claim:

1. A defect monitor for locating and characterizing the defects in a semiconductor device using a scanning electron microscope in voltage contrast mode (SEM-VC), the defect monitor comprising:

a) a plurality of floating monitor shapes, said plurality of monitor shapes comprising conducting material fabricated into a first level of said semiconductor device;

b) a plurality of monitor lines, said plurality of monitor lines fabricated into said first level of said semiconductor device, said plurality of monitor lines being interdigited between said plurality of floating monitor shapes, said plurality of monitor lines each grounded at a first end;

c) a plurality of flags, said flags comprising conducting material, each of said plurality of flags connected to a second end of said plurality of monitor lines, wherein any of said plurality of flags that are grounded through said plurality of monitor lines provide a contrast with said plurality of flags that are floating due to a defect when said plurality of flags are scanned by said SEM-VC.

2. The defect monitor of claim 1 wherein said each of said plurality of monitor shapes has an area between 10–50 $\mu m^2$.

3. The defect monitor of claim 1 wherein said each of said plurality of flags has an area between 10–50 $\mu m^2$.

4. The defect monitor of claim 1 wherein said plurality of flags are arranged in a column.

5. The defect monitor of claim 1 wherein said plurality of monitor shapes are arranged in a plurality of columns with adjacent columns offset.

6. The defect monitor of claim 1 wherein said plurality of monitor lines are fabricated a predetermined distance from said monitor shapes and wherein said predetermined distance is substantially equal to a minimum design width of said semiconductor device.

7. The defect monitor of claim 1 further comprising a plurality of interlevel monitor shapes, said interlevel monitor shapes fabricated to be floating in a second level above said monitor shapes and said monitor lines.

8. The defect monitor of claim 1 further wherein said plurality of flags are arranged in a column and wherein said plurality of monitor shapes are arranged in a array adjacent said column of flags, such that said SEM-VC scan of said plurality of flags scans down said column of flags and wherein said contrast indicates the presence of a defect and wherein said SEM-VC scan then scans down said array of monitor shapes until said defect is located.

9. A defect monitor for locating and characterizing the defects in a semiconductor device using a scanning electron microscope in voltage contrast mode (SEM-VC), the defect monitor comprising:

a) a plurality of floating monitor shapes, each of said plurality of floating monitor shapes comprising conducting material fabricated into a first level of said semiconductor device, said plurality of floating monitor shapes arranged in an array;

b) a plurality of monitor lines, said plurality of monitor lines fabricated into said first level of said semiconductor device, each of said plurality of monitor lines grounded at a first end, said plurality of monitor lines running between said plurality of monitor shapes and maintaining a distance to said plurality of monitor shapes substantially equal to a minimum conductor distance during at least a portion of their run;

c) a plurality of flags, said flags comprising conducting material, each of said plurality of flags connected to a second end of each of said plurality of monitor lines; wherein said plurality of flags that are grounded through said plurality of monitor lines contrast with said plurality of flags that are floating when said plurality of flags are scanned by said SEM-VC and wherein said plurality of monitor shapes that are grounded due to a defect contrast with said plurality of monitor shapes that are floating.

10. A method for determining the distribution and character of defects in a semiconductor device, the method comprising the steps of:

a) providing a defect monitor, said defect monitor including:

i) a plurality of floating monitor shapes, said plurality of monitor shapes comprising conducting material fabricated into a first level of said semiconductor device;

ii) a plurality of monitor lines, said plurality of monitor lines fabricated into said first level of said semiconductor device, said plurality of monitor lines being interdigited between said plurality of floating monitor shapes; said plurality of monitor lines each being grounded at a first end;

iii) a plurality of flags, said flags comprising conducting material, each of said plurality of flags connected to a second end of said plurality of monitor lines;

b) scanning said plurality of flags with a scanning electron microscope in voltage contrast mode (SEM-VC) such that any of said plurality of flags which are not grounded through said plurality of monitor lines due to a defect will contrast with said plurality of flags that are grounded through said plurality of monitor lines.

11. The method of claim 10 further comprising:

a) locating each of said plurality of flags that is ungrounded;

b) scanning said monitor lines connected to said ungrounded plurality of flags with a SEM-VC scan until defect causing said monitor line open is located.

12. The method of claim 10 further comprising:

a) scanning said plurality of monitor shapes with said SEM-VC; and b) locating each of said plurality of monitor shapes which are grounded though said plurality of monitor lines.

13. The method of claim 10 further comprising:

a) providing a plurality of floating interlevel monitor shapes at a second level of said semiconductor device;

b) scanning said plurality of interlevel monitor shapes with a SEM-VC scan, such that each of said plurality of floating interlevel monitor shapes which are grounded are contrasted from said floating interlevel monitor shape.

14. The method of claim 10 wherein the step of scanning said plurality of flags comprises scanning at a magnification between 60× and 100×.

15. The method of claim 11 wherein the step of scanning said plurality of flags comprises scanning at a magnification between 60× and 100× and wherein the step of scanning said monitor lines connected to said ungrounded plurality of flags comprises scanning at a magnification between 500× and 1000×.

* * * * *